(12) United States Patent
Gidney et al.

(10) Patent No.: US 12,175,328 B2
(45) Date of Patent: Dec. 24, 2024

(54) EFFICIENT FAULT-TOLERANT TROTTER SIMULATION OF MOLECULAR HAMILTONIANS

(71) Applicant: Google LLC, Mountain View, CA (US)

(72) Inventors: Craig Gidney, Goleta, CA (US); Ryan Babbush, Venice, CA (US); Ian David Kivlichan, Cambridge, MA (US)

(73) Assignee: Google LLC, Mountain View, CA (US)

( * ) Notice: Subject to any disclaimer, the term of this patent is extended or adjusted under 35 U.S.C. 154(b) by 889 days.

(21) Appl. No.: 17/276,668

(22) PCT Filed: Aug. 13, 2019

(86) PCT No.: PCT/US2019/046368
§ 371 (c)(1),
(2) Date: Mar. 16, 2021

(87) PCT Pub. No.: WO2020/091874
PCT Pub. Date: May 7, 2020

(65) Prior Publication Data
US 2021/0272009 A1  Sep. 2, 2021

Related U.S. Application Data

(60) Provisional application No. 62/753,451, filed on Oct. 31, 2018.

(51) Int. Cl.
*G06N 10/00* (2022.01)
*H03K 19/195* (2006.01)
*H03K 19/20* (2006.01)

(52) U.S. Cl.
CPC ........... *G06N 10/00* (2019.01); *H03K 19/195* (2013.01); *H03K 19/20* (2013.01)

(58) Field of Classification Search
CPC ...... G06F 30/00; G06N 10/00; H03K 19/195; H03K 19/20
(Continued)

(56) References Cited

U.S. PATENT DOCUMENTS 10,540,604 B1 *  1/2020  Papageorge ............ G06F 13/36
11,308,248 B2 *  4/2022  Matsuura ............... G06N 10/20

FOREIGN PATENT DOCUMENTS

CN    107980145    5/2018
CN    108140145    6/2018
CN    108701263    10/2018

OTHER PUBLICATIONS

Babbush, Ryan et al., "Low Depth Quantum Simulation of Electronic Structure", Jan. 16, 2018. (Year: 2018).*

(Continued)

*Primary Examiner* — Cedric Johnson
(74) *Attorney, Agent, or Firm* — Fish & Richardson P.C.

(57) ABSTRACT

Methods, systems and apparatus for determining properties of a physical system described by an electronic structure Hamiltonian. In one aspect, a Hamiltonian describing the physical system is transformed into a qubit Hamiltonian describing a corresponding system of qubits. The qubit Hamiltonian comprises multiple two-qubit interaction terms, each comprising a respective translation invariant coefficient. The system of qubits is evolved under a unitary operator generated by the multiple two-qubit interaction terms. The evolution includes applying layers of quantum logic gates to the system of qubits, wherein each application of a layer evolves the system of qubits under a unitary operator generated by a respective subset of the multiple two-qubit interaction terms and wherein the value of the coefficients of the subset of the multiple two-qubit interaction terms that generate the unitary operator is constant. The (Continued)

evolved system of qubits is measured and properties of the physical system is determined.

15 Claims, 4 Drawing Sheets

(58) Field of Classification Search
USPC .......................................................... 703/13
See application file for complete search history.

(56) References Cited

OTHER PUBLICATIONS

Somma, R. et al., "Simulating Physical Phenomena by Quantum Networks", Apr. 9, 2002, Physical Review A, vol. 65, The American Physical Society. (Year: 2002).*
Kivlichan, Ian D et al., "Quantum Simulation of Electronic Structure with Linear Depth and Connectivity", Mar. 13, 2018, Physical Review Letters 120, The American Physical Society. (Year: 2018).*
PCT International Search Report and Written Opinion in International Appln. No. PCT/US2019/046368, dated Nov. 26, 2019, 20 pages.
AU Office Action in Australian Application No. 2019370097, dated Nov. 26, 2021, 3 pages.
Notice of Allowance in Australian Appln. No. 2022202653, mailed on Jan. 15, 2024, 3 pages.
Abrams et al., "Quantum algorithm providing exponential speed increase for finding eigenvalues and eigenvectors," Physical Review Letters, Dec. 1999, 83(24):5162.
Aspuru-Guzik et al., "Simulated quantum computation of molecular energies," Science, Sep. 2005, 309(5741):1704-7.
Babbush et al., "Adiabatic quantum simulation of quantum chemistry," Scientific reports, Oct. 2014, 4(1):1-1.
Babbush et al., "Chemical basis of Trotter-Suzuki errors in quantum chemistry simulation," Physical Review A, Feb. 2015, 91(2):022311.
Babbush et al., "Encoding electronic spectra in quantum circuits with linear T complexity," Physical Review X, Oct. 2018, 8(4):041015.
Babbush et al., "Exponentially more precise quantum simulation of fermions in second quantization," New Journal of Physics, Mar. 2016, 18(3):033032.
Babbush et al., "Exponentially more precise quantum simulation of fermions in the configuration interaction representation," Quantum Science and Technology, Dec. 2017, 3(1):015006.
Babbush et al., "Low depth quantum simulation of electronic structure," arXiv preprint arXiv:1706.00023, May 2017, 41 pages.
Babbush et al., Low-depth quantum simulation of materials. Physical Review X. Mar. 21, 2018;8(1):011044.
Barkoutsos et al., "Fermionic Hamiltonians for quantum simulations: a general reduction scheme," arXiv preprint arXiv:1706.03637, Jun. 2017, 6 pages.
Bauer et al., "Hybrid quantum-classical approach to correlated materials," Physical Review X, Sep. 2016, 6(3):031045.
Bernien et al., "Probing many-body dynamics on a 51-atom quantum simulator," Nature, Nov. 2017, 551(7682):579-84.
Berry et al., "Improved techniques for preparing eigenstates of fermionic Hamiltonians," npj Quantum Information, May 2018, 4(1):1-7.
Berry et al., "Simulating Hamiltonian dynamics with a truncated Taylor series," Physical review letters, Mar. 2015, 114(9):090502.
Bocharov et al., "Efficient synthesis of universal repeat-until-success quantum circuits," Physical Review Letters, Feb. 2015, 114(8):080502.
Boixo et al., "Characterizing quantum supremacy in near-term devices," Nature Physics, Jun. 2018, 14(6):595-600.
Bravyi et al., "Fermionic quantum computation," Annals of Physics, May 2002, 298(1):210-26.
Bravyi et al., "Tapering off qubits to simulate fermionic Hamiltonians," arXiv preprint arXiv:1701.08213, Jan. 2017, 15 pages.
Bruus et al., "Many-body quantum theory in condensed matter physics: an introduction, " Oxford University Press, Sep. 2004, 8 pages.
Castelvecchi et al., "IBM's quantum cloud computer goes commercial," Nature News, Mar. 2017, 543(7644):159.
Ceperley et al., "Ground state of the electron gas by a stochastic method," Physical review letters, Aug. 1980, 45(7):566.
Chandran et al., "Spectral tensor networks for many-body localization," Physical Review B, Jul. 2015, 92(2):024201.
Childs et al., "Toward the first quantum simulation with quantum speedup," Proceedings of the National Academy of Sciences, Sep. 2018, 115(38):9456-61.
Colless et al., "Robust determination of molecular spectra on a quantum processor," arXiv preprint arXiv:1707.06408, Jul. 2017, 12 pages.
Corboz et al., "Improved energy extrapolation with infinite projected entangled-pair states applied to the two-dimensional Hubbard model," Physical Review B, Jan. 2016, 93(4):045116.
Córcoles et al., Demonstration of a quantum error detection code using a square lattice of four superconducting qubits. Nature communications. Apr. 29, 2015;6(1):1-0.
Du et al., "NMR implementation of a molecular hydrogen quantum simulation with adiabatic state preparation," Physical Review Letters, Jan. 2010, 104(3):030502.
Ferris et al., "Fourier transform for fermionic systems and the spectral tensor network," Physical review letters, Jul. 2014, 113(1):010401.
Feynman et al., "Simulating physics with computers," Int. J. Theor. Phys., May 1982, 22 pages.
Fowler et al. [online], "Kaleidoscope," 2012, retrieved on Mar. 18, 2021, retrieved from URL<https://journals.aps.org/pra/kaleidoscope/pra/86/3/032324, 8 pages.
Fowler et al., "A bridge to lower overhead quantum computation," arXiv preprint arXiv:1209.0510, Sep. 2012, 17 pages.
Fowler et al., "Optimal complexity correction of correlated errors in the surface code," arXiv preprint arXiv:1310.0863, Oct. 2013, 6 pages.
Fowler et al., "Surface codes: Towards practical large-scale quantum computation," Physical Review A., Sep. 2012, 86(3):032324.
Gidney et al., "Halving the cost of quantum addition," Quantum, Jun. 2018, 6 pages.
Havlíček et al., "Operator locality in the quantum simulation of fermionic models," Physical Review A., Mar. 2017, 95(3):032332.
Hubbard et al., "Electron correlations in narrow energy bands," Proceedings of the Royal Society of London, Nov. 1963, 276(1365):238-57.
IBM.com [online], "IBM Quantum Experience is quantum on the cloud," 2017, retrieved on Mar. 18, 2021, retrieved from URL<https://www.ibm.com/quantum-computing/experience/?p1=Search&p4=43700050385922648&p5=b&gclid=EAIaIQobChMIufb3jrm67wIVApJbCh1XfggjEAAYASABEgKaZvD_BwE&gclsrc=aw.dst>, 8 pages.
Jordan et al., "über das paulische äquivalenzverbot," The Collected Works of Eugene Paul Wigner, 1993, 2 pages.
Kandala et al., "Hardware-efficient variational quantum eigensolver for small molecules and quantum magnets," Nature, Sep. 2017, 549(7671):242-6.
Kassal et al., "Polynomial-time quantum algorithm for the simulation of chemical dynamics," Proceedings of the National Academy of Sciences, Dec. 2008, 105(48):18681-6.
Kelly et al., "State preservation by repetitive error detection in a superconducting quantum circuit," Nature, Mar. 2015, 519(7541):66-9.
Kitaev et al., "Quantum measurements and the Abelian stabilizer problem," arXiv preprint quant-ph/9511026, Nov. 1995, 22 pages.
Kivlichan et al., "Bounding the costs of quantum simulation of many-body physics in real space," Journal of Physics A: Mathematical and Theoretical, Jun. 2017, 50(30):305301.
Kivlichan et al., "Improved fault-tolerant quantum simulation of condensed-phase correlated electrons via Trotterization, " Quantum, Jul. 2020, 45 pages.

(56) References Cited

OTHER PUBLICATIONS

Kivlichan et al., "Quantum simulation of electronic structure with linear depth and connectivity," Physical review letters, Mar. 2018, 120(11):110501.
Lanyon et al., "Towards quantum chemistry on a quantum computer," Nature Chemistry, Feb. 2010, 2(2):106-11.
LeBlanc et al., "Magnetic susceptibility and simulated neutron signal in the two-dimensional Hubbard model, " Phys. Rev. X 5, 041041, 2015, 10 pages.
Lee et al., "Doping a Mott insulator: Physics of high-temperature superconductivity," Reviews of Modern Physics, Jan. 2006, 78(1):17.
Li et al., "Solving quantum ground-state problems with nuclear magnetic resonance," Scientific reports, Sep. 2011, 1(1):1-8.
Lloyd et al., "Universal quantum simulators," Science, Aug. 1996, 7 pages.
Loos et al., "The uniform electron gas," Wiley Interdisciplinary Reviews: Computational Molecular Science, Jul. 2016, 6(4):410-29.
Low et al., "Hamiltonian simulation by qubitization," Quantum, Jul. 2019, 23 pages.
Low et al., "Hamiltonian simulation in the interaction picture," arXiv preprint arXiv:1805.00675, May 2018, 30 pages.
Low et al., "Optimal Hamiltonian simulation by quantum signal processing," Physical Review Letters, Jan. 2017, 118(1):010501.
McClain et al., "Spectral functions of the uniform electron gas via coupled-cluster theory and comparison to the G W and related approximations," Physical Review B., Jun. 2016, 93(23):235139.
McClean et al., "Exploiting locality in quantum computation for quantum chemistry," The journal of physical chemistry letters, Dec. 2014, 5(24):4368-80.
McClean et al., "Hybrid quantum-classical hierarchy for mitigation of decoherence and determination of excited states," Physical Review A, Apr. 2017, 95(4):042308.
McClean et al., "OpenFermion: the electronic structure package for quantum computers," Quantum Science and Technology, Jun. 2020, 5(3):034014.
Mohseni et al., "Commercialize quantum technologies in five years," Nature News, Mar. 2017, 543(7644):171.
Motta et al., "Low rank representations for quantum simulation of electronic structure," arXiv preprint arXiv:1808.02625, Aug. 2018, 8 pages.
Motzoi et al., "Linear and logarithmic time compositions of quantum many-body operators," Physical review letters, Oct. 2017, 119(16):160503.
Nam et al., "Low-cost quantum circuits for classically intractable instances of the Hamiltonian dynamics simulation problem," npj Quantum Information, May 2019, 5(1):1-8.
Nordstrom et al., "Pebble games, proof complexity, and time-space trade-offs," arXiv preprint arXiv:1307.3913, Jul. 2013, 63 pages.
O'Malley et al., "Scalable quantum simulation of molecular energies," Physical Review X, Jul. 2016, 6(3):031007.
PCT International Preliminary Report on Patentability in International Appln. No. PCT/US2019/046368, dated Nov. 26, 2019, 20 pages.
Peruzzo et al., "A variational eigenvalue solver on a photonic quantum processor," Nature communications, Jul. 2014, 5(1):1-7.
Poulin et al., "Quantum algorithm for spectral measurement with a lower gate count," Physical review letters, Jul. 2018, 121(1):010501.
Reiher et al., "Elucidating reaction mechanisms on quantum computers," Proceedings of the National Academy of Sciences, Jul. 2017, 114(29):7555-60.
Romero et al., "Strategies for quantum computing molecular energies using the unitary coupled cluster ansatz," Quantum Science and Technology, Oct. 2018, 4(1):014008.
Rubin et al., "Application of fermionic marginal constraints to hybrid quantum algorithms," New Journal of Physics, May 2018, 20(5):053020.
San et al., "Hamming weight and tight constraints of multi-qubit entanglement in terms of unified entropy," Scientific Reports, Aug. 2018, 8(1):1-0.
Seeley et al., "The Bravyi-Kitaev transformation for quantum computation of electronic structure," The Journal of chemical physics, Dcember 2012, 137(22):224109.
Shen et al., "Quantum Implementation of Unitary Coupled Cluster for Simulating Molecular Electronic Structure," Physical Review, 2017, 6 pages.
Shepherd et al., "Many-body quantum chemistry for the electron gas: Convergent perturbative theories," Physical review letters, May 2013, 110(22):226401.
Shepherd et al., "Range-separated Brueckner coupled cluster doubles theory," Physical review letters, Apr. 2014, 112(13):133002.
Somma et al., "Simulating physical phenomena by quantum networks," Physical Review A., Apr. 2002, 65(4):042323.
Toloui et al., "Quantum algorithms for quantum chemistry based on the sparsity of the CI-matrix," arXiv preprint arXiv:1312.2579, Dec. 2013, 20 pages.
Verstraete et al., "Quantum circuits for strongly correlated quantum systems," Physical Review A, Mar. 2009, 79(3):032316.
Wang et al., "Quantum simulation of helium hydride cation in a solid-state spin register," ACS nano, Aug. 2015, 9(8):7769-74.
Wecker et al., "Gate-count estimates for performing quantum chemistry on small quantum computers," Physical Review A., Aug. 2014, 90(2):022305.
Wecker et al., "Progress towards practical quantum variational algorithms," Physical Review A., Oct. 2015, 92(4):042303.
Wecker et al., "Solving strongly correlated electron models on a quantum computer," Physical Review A., Dec. 2015, 92(6):062318.
White et al., "Hybrid grid/basis set discretizations of the Schrödinger equation," The Journal of Chemical Physics, Dec. 2017, 147(24):244102.
Whitfield et al., "Local spin operators for fermion simulations," Physical Review A, Sep. 2016, 94(3):030301.
Whitfield et al., "Simulation of Electronic Structure Hamiltonians Using Quantum Computers," Mol. Phys., 2011, 22 pages.
Wu et al., "Polynomial-time simulation of pairing models on a quantum computer," Physical Review Letters, Jul. 2002, 89(5):057904.
Zhang et al., "Observation of a many-body dynamical phase transition with a 53-qubit quantum simulator," Nature, Nov. 2017, 551(7682):601-4.
Zhu et al., "Hardware-efficient fermionic simulation with a cavity—QED system," npj Quantum Information, Feb. 2018, 4(1):1-0.
PCT International Preliminary Report on Patentability in International Appln. No. PCT/US2019/046368, dated May 14, 2021, 14 pages.
International Preliminary Report on Patentability in International Appln. No. PCT/US2019/046368, mailed on May 17, 2021, 14 pages.
Office Action in Canadian Appln. No. 3,114,094, dated Mar. 20, 2023, 3 pages.
Office Action in Australian Appln. No. 2022202653, dated Jan. 6, 2023, 2 pages.
Office Action in Canadian Appln. No. 3,114,094, dated May 19, 2022, 4 pages.
Office Action in Chinese Appln. No. 201980063375.3, mailed on May 28, 2024, 30 pages (with English translation).
Office Action in European Appln. No. 19758873.4, mailed on Apr. 10, 2024, 10 pages.

* cited by examiner

200

Transform Hamiltonian describing physical system into qubit Hamiltonian describing corresponding system of qubits
202

↓

Evolve system of qubits under unitary operator generated by multiple two-qubit interaction terms by applying multiple layers of quantum logic gates to the system of qubits, wherein in each layer the value of the two-qubit interaction term coefficients for the layer is constant
204

↓

Measure evolved system of qubits
206

↓

Determine properties of the physical system
208

FIG. 2

```
┌─────────────────────────────────────────────┐
│  Arrange N qubits as two-dimensional grid,  │
│  where the position of each qubit is        │
│  represented by a position vector p     302 │
└─────────────────────────────────────────────┘
                      │
                      ▼
┌─────────────────────────────────────────────┐
│  For each index vector s, define a set of   │
│  pairs of qubits {p, p+s} for each p    304 │
└─────────────────────────────────────────────┘
                      │
                      ▼
┌─────────────────────────────────────────────┐
│  Generate two layers of interacting qubits  │
│  based on the defined set of pairs of       │
│  qubits, where each qubit in each layer     │
│  interacts with one other qubit         306 │
└─────────────────────────────────────────────┘
```

*FIG. 3A*

```
┌─────────────────────────────────────────────┐
│  Arrange N qubits as two-dimensional grid,  │
│  where the position of each qubit is        │
│  represented by a position vector p     352 │
└─────────────────────────────────────────────┘
                      │
                      ▼
┌─────────────────────────────────────────────┐
│  For each index vector s, define a set of   │
│  pairs of qubits {p, p+s} for each p, where │
│  one qubit is not included in the defined   │
│  set of pairs                           354 │
└─────────────────────────────────────────────┘
                      │
                      ▼
┌─────────────────────────────────────────────┐
│  Generate three layers of interacting       │
│  qubits based on the defined set of pairs   │
│  of qubits, where in the first and second   │
│  layers each qubit in both layer interacts  │
│  with one other qubit, and the third layer  │
│  includes one qubit                     356 │
└─────────────────────────────────────────────┘
```

*FIG. 3B*

EFFICIENT FAULT-TOLERANT TROTTER SIMULATION OF MOLECULAR HAMILTONIANS

CROSS-REFERENCE TO RELATED APPLICATION

This application is a National Stage Application under 35 U.S.C. § 371 and claims the benefit of International Application No. PCT/US2019/046368, filed Aug. 13, 2019, which claims priority to U.S. Application No. 62/753,451, filed Oct. 31, 2018, the disclosure of which is incorporated herein by reference.

BACKGROUND

This specification relates to quantum computing.

Quantum simulators are devices designed to provide information and insights about physical systems or devices. Quantum simulators enable physical systems that are difficult to study in a laboratory or impossible to model using a classical processor to be simulated.

SUMMARY

This specification describes technologies for performing fault tolerant Trotter simulations of molecular Hamiltonians.

In general, one innovative aspect of the subject matter described in this specification can be implemented in a method for determining properties of a physical system, the method comprising: transforming a Hamiltonian describing the physical system into a qubit Hamiltonian describing a corresponding system of qubits, wherein the qubit Hamiltonian comprises multiple two-qubit interaction terms, each two-qubit interaction term comprising a respective translation invariant two-qubit interaction term coefficient; evolving the system of qubits under a unitary operator generated by the multiple two-qubit interaction terms, comprising: applying multiple layers of quantum logic gates to the system of qubits, wherein each application of a layer of the multiple layers evolves the system of qubits under a unitary operator generated by a respective subset of the multiple two-qubit interaction terms; wherein the value of the two-qubit interaction term coefficients of the subset of the multiple two-qubit interaction terms that generate the unitary operator is constant; measuring the evolved system of qubits; and determining, based on the measurements of the evolved system of qubits, one or more properties of the physical system.

Other implementations of this aspect include corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations each of the multiple layers of quantum logic gates comprises rotations operations with a same rotation angle.

In some implementations the method further comprises generating the multiple layers of quantum logic gates, comprising, for a system of N even qubits: arranging the N qubits as a two-dimensional grid of qubits, wherein the position of each qubit in the grid is represented by a position vector p; for each index vector s: defining a set of pairs of qubits (p, p+s) for each position vector p running over all the N qubits; generating two layers of qubit interactions based on the defined set of pairs of qubits, wherein each qubit in each layer interacts with one other qubit.

In some implementations each of the multiple layers of quantum logic gates comprise N/2 equiangular rotation operations.

In some implementations the method further comprises generating the multiple layers of quantum logic gates, comprising, for a system of N odd qubits: arranging the N qubits as a two-dimensional grid of qubits, wherein the position of each qubit in the grid is represented by a position vector p; for each index vector s: defining a set of pairs of qubits (p, p+s) for each position vector p running over all the N qubits, wherein one qubit is not included in the defined set of pairs; generating three layers of qubit interactions based on the defined set of pairs of qubits, comprising a first layer wherein each qubit interacts with one other qubit, a second layer wherein each qubit interacts with one other qubit, and a third layer comprising a single rotation operation.

In some implementations the first layer and second layer of quantum logic gates each comprise (N−1)/2 equiangular rotation operations.

In some implementations evolving the system of qubits under a unitary operator generated by the multiple two-qubit interaction terms further comprises, in each of the multiple layers, applying Hamming weight phasing to rotations in the layer.

In some implementations defining a set of pairs of qubits (p, p+s) for each qubit p comprises evaluating p+s modulo the grid length.

In some implementations the qubit Hamiltonian further comprises a kinetic energy term and a single-qubit potential energy term, and wherein the method further comprises evolving the system of qubits under a unitary operator generated by the kinetic energy term and a unitary operator generated by the single-qubit potential energy term.

In some implementations evolving the system of qubits under a unitary operator generated by the multiple two-qubit interaction terms, kinetic energy term or single-qubit potential energy term comprises implementing time evolution or implementing evolution directionally controlled on an ancilla.

In some implementations evolving the system of qubits under a unitary operator generated by the multiple two-qubit interaction terms, kinetic energy term or single-qubit potential energy term comprises evolving the system of qubits in a split operator trotter step.

In some implementations the split operator Trotter step is one of multiple split operator Trotter steps that yields a smallest Trotter error.

In some implementations the Hamiltonian describing the physical system comprises an electronic structure Hamiltonian.

In some implementations the physical system comprises a chemical or material, and wherein determining properties of the physical system based on the measurements of the evolved system of qubits comprises determining properties of the chemical or material using the simulated evolution of the system of qubits under the qubit Hamiltonian.

The subject matter described in this specification can be implemented in particular ways so as to realize one or more of the following advantages.

The presently described disclosure represents a significant and widely applicable improvement to the state of the art in quantum simulation.

When determining (e.g., simulating) evolution of the electronic structure Hamiltonian using Trotter-based methods, evolution of the interaction part of the potential energy operator in general appears to require application of $O(N^2)$ rotations to N qubits. The techniques described in this application reduce the required number of applications of rotations to $O(N \log N)$ at a cost of $4(N-1)(N-2)$ additional T gates. Because the number of T gates needed to synthesize each rotation is much larger than 4, this greatly reduces the fault-tolerant cost of determining these terms.

In addition, the techniques described in this specification can be applied to any quantum simulation of an electronic structure Hamiltonian using the plane wave dual basis, or more generally to any simulation of a two-qubit interaction term with the translation invariance property of equation (3) below. A wide variety of settings can therefore benefit from the described techniques. For example, the techniques can be used to more efficiently design and test materials or catalysts, to more accurately predict rates of certain chemical reactions or to more efficiently synthesize pharmaceuticals.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2 is a flow diagram of an example process for determining properties of a physical system.

FIG. 3A is a flow diagram of an example process for determining interactions in each of multiple layers of quantum logic gates that are applied to an even number of qubits.

FIG. 3B is a flow diagram of an example process for determining interactions in each of multiple layers of quantum logic gates that are applied to an odd number of qubits.

Like reference numbers and designations in the various drawings indicate like elements.

DETAILED DESCRIPTION

The electronic structure Hamiltonian describes the properties of interacting electrons in the presence of stationary nuclei. The physics of these systems determines the rates of chemical reactions as well as the properties of most materials. Determining the electronic structure Hamiltonian therefore has applications in a variety of different areas ranging from pharmaceutical synthesis to the design of novel catalysts and materials.

The dynamics of these systems are typically intractable for classical computers. Therefore, a variety of approaches to quantum simulation of the electronic structure have been developed, including algorithms in second quantization, first quantization, real space, adiabatic algorithms, approaches based on the Taylor series method of time-evolution and other algorithms using the linear combination of unitary operators framework, variational algorithms, Bravyi-Kitaev encodings, reduced locality Jordan-Wigner encodings and low rank tensor decompositions of the Coulomb operator. However, the only approaches that are compiled all the way down to basic gate sets and have been rigorously assessed for viability within error-correction have been Trotter-based methods in a second-quantized basis.

This specification describes new and improved techniques that build upon such Trotter-based methods. The techniques reduce the number of rotation operations needed to implement evolution under the interaction part of a potential energy operator in a split-operator Trotter step. In general, evolution under the interaction part of the potential energy operator requires $O(N^2)$ rotations for N qubits. However, by working in the plane wave dual basis and constructing ordered layers of quantum logic gates where equiangular rotations are grouped together, Hamming weight phasing can be applied and the cost of evolution under the interaction part of the potential energy operator can be reduced to $O(N \log N)$ rotations.

Example Hardware

Figure 1:
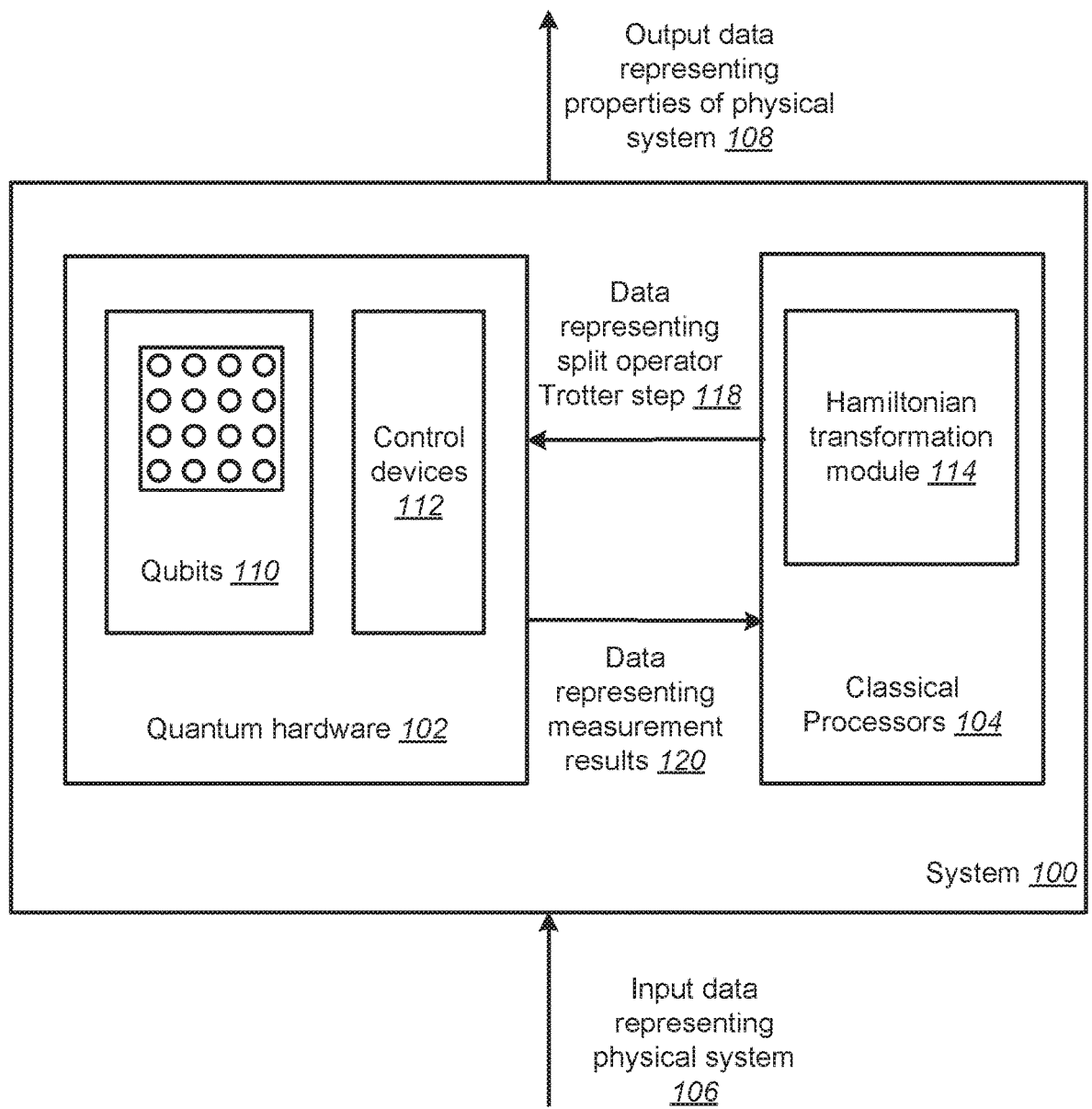
FIG. 1 depicts an example system for determining properties of a physical system.

FIG. 1 depicts an example system 100 for determining a physical system described by an electronic structure Hamiltonian. The example system 100 is an example of a system implemented as classical or quantum computer programs on one or more classical computers or quantum computing devices in one or more locations, in which the systems, components, and techniques described below can be implemented.

The system 100 may include quantum hardware 102 in data communication with a classical processor 104. The system 100 may receive as input data that may include data representing a physical system of interest, e.g., input data 106. The received data representing a physical system of interest may include data representing a Hamiltonian describing a physical system that is to be modeled or simulated. In some implementations the received data may include data representing an electronic structure Hamiltonian that describes a corresponding physical system, e.g., a single molecule, material, or a chemical.

The system may generate as output data representing results of determining the physical system of interest, e.g., output data representing determined physical properties of the physical system 108. For example, as described above, in some implementations the physical system may be a chemical. In these cases data representing simulation results may be used to determine properties of the chemical, e.g., a rate of a chemical reaction. As another example, also described above, in some implementations the physical system may be a material, e.g., a semiconductor. In these cases data representing simulation results may be used to determined properties of the material, e.g., conductivity.

The system 100 is configured to perform classical computations in combination with quantum computations using the classical processors 104 and quantum hardware 102. The classical processors 104 may include a Hamiltonian transformation module 114 that is configured to process received input data representing a Hamiltonian describing a physical system, e.g., input data 106, and generate data representing a qubit Hamiltonian describing a system of qubits that corresponds to the physical system. For example, the Hamiltonian transformation module 114 may be configured to apply the Jordan-Wigner transform to the received input data 106 to generate data representing a corresponding qubit Hamiltonian.

The quantum hardware 102 is configured to determine, e.g., by simulation, the evolution of the physical system specified by the input data 106 using corresponding data representing a qubit Hamiltonian describing a system of qubits. For example, as described in detail below with reference to FIGS. 2-4, the quantum hardware 102 may be configured to implement a Trotter step, e.g., a split operator Trotter step 118, by applying quantum circuits effecting a unitary operator that is dependent on the qubit Hamiltonian on a state of a system of qubits 110 included in the quantum hardware.

The type of qubits 110 included in the quantum hardware 102 is dependent on a variety of factors, e.g., the type of physical system to be determined or simulated, or laboratory constraints, and may vary. For example, in some cases it may be convenient to include one or more resonators attached to one or more superconducting qubits, e.g., Gmon or Xmon qubits. In other cases ion traps, photonic devices or superconducting cavities (with which states may be prepared without requiring qubits) may be used. Further example realizations of qubits include fluxmon qubits, silicon quantum dots or phosphorus impurity qubits.

The qubits 110 may be arranged as a grid with controllable interactions between qubits. The one or more control devices 112 include devices, e.g., arbitrary waveform generators, that are configured to apply quantum circuits of quantum logic gates, e.g., rotation operations, to the qubits 110, e.g., through application of respective control pulses along control lines that couple the qubits 110 to the control devices 112. The control devices 112 may further include devices, e.g., readout resonators, that are configured to perform measurements on the qubits 110 and provide measurement results 120 to the classical processors 104.

Measurement results 120 received by the classical processors 104 may be processed to determine properties of the physical system specified by the input data 106, as described in detail below with reference to step 208 of FIG. 2.

Programming the Hardware

FIG. 2 is a flow diagram of an example process 200 for determining properties of a physical system. For convenience, the process 200 will be described as being performed by a system of one or more classical or quantum computing devices located in one or more locations. For example, a quantum computation system, e.g., the system 100 of FIG. 1, appropriately programmed in accordance with this specification, can perform the process 200.

The system transforms a Hamiltonian describing the physical system into a qubit Hamiltonian describing a corresponding system of qubits (step 202). For example, the Hamiltonian describing the physical system may be a fermionic Hamiltonian of the form $$H = \sum_{pq} T_{pq} a_p^\dagger a_q + \sum_p U_p n_p + \sum_{p \neq q} V_{pq} n_p n_q \qquad (1)$$

where $T_{pq}$, $U_p$, and $V_{pq}$ represent numbers defined by integrals over molecular orbitals, arising from the kinetic energy, external potential, and electron-electron Coulomb repulsion, respectively and the creation and annihilation operators $a_p$, $a_p^\backslash$ index, for example, lattice sites and/or the spin-orbitals through vectors p and q. $T_{pq}$, $U_p$, and $V_{pq}$ may represent real numbers. In some implementations, one or more of $T_{pq}$ and/or $V_{pq}$ may be complex, as long as the overall Hermitian nature of the Hamiltonian is preserved. In some implementations the Hamiltonian H may be a Hamiltonian describing a material, e.g., a polymer airplane wing or rocket, solar cells, batteries, catalytic converts or thin-film electronics, or a Hamiltonian describing a chemical.

A Hamiltonian taking the form of equation (1) can be transformed into a qubit Hamiltonian describing a corresponding system of qubits using the Jordan-Wigner transform. The Jordan-Wigner transform transforms fermionic annihilation and creation operators $a_p^\backslash$ and $a_p$ to Pauli operators $X_p$, $Y_p$, $Z_p$ that correspond to spin ½ particles. The standard form of the Jordan-Wigner transformation is given by $a_p^\backslash \rightarrow \frac{1}{2}(X_p - iY_p)Z_{p-1} \ldots Z_1$ and $a_p \rightarrow \frac{1}{2}(X_p + iY_p)Z_{p-1} \ldots Z_1$. Transforming the Hamiltonian of equation (1) using the Jordan-Wigner transform results in the qubit Hamiltonian given in equation (2) below, where an identity term has been omitted since it is trivial to determine.

$$H_{qubit} = \qquad (2)$$
$$\sum_{pq} \tilde{T}_{pq} (X_P Z_{r_i} Z_{r_{i+1}} \ldots Z_{r_{i+k}} X_q + Y_P Z_{r_i} Z_{r_{i+1}} \ldots Z_{r_{i+k-1}} Z_{r_{i+k}} Y_q) +$$
$$\sum_p \tilde{U}_P Z_P + \sum_{pq} \tilde{V}_{pq} Z_p Z_q$$

In equation (2) $X_p$, $Y_p$ and $Z_p$ represent Pauli X, Y and Z gates, respectively, acting on the qubit indexed by p in the Jordan-Wigner ordering, $Z_{r_i} Z_{r_{i+1}} \ldots Z_{r_{i+k}}$ represents a string of Pauli Z gates between qubit p and qubit q in the Jordan-Wigner order (needed to preserve the appropriate commutation relations for the transformed fermionic creation and annihilation operators) and $\tilde{T}_{pq}$, $\tilde{U}_p$ and $\tilde{V}_{pq}$ represent coefficients that can be directly computed from the corresponding coefficients in the second quantized Hamiltonian given by equation (1) above.

The Hamiltonian of equation (1) can be expressed in one of multiple different bases. For convenience, in equation (1) the Hamiltonian H is written in the plane wave basis. However, one or more of the terms of the Hamiltonian H may also be expressed in the plane wave dual basis. The plane wave dual basis can be obtained by applying a unitary discrete Fourier transformation to the plane wave basis.

In the plane wave dual basis, the qubit Hamiltonian $H_{qubit}$ includes multiple two-qubit interaction terms $\tilde{V}_{pq} Z_p Z_q$ with translation invariant coefficients $\tilde{V}_{pq}$. That is, for any vector s indexing a particular qubit in the system of qubits $$\tilde{V}_{p,q} = \tilde{V}_{p+s,q+s}. \qquad (3)$$

To determine properties of the physical system, the system performs a quantum simulation of evolution of the physical system under the Hamiltonian H using the system of qubits and qubit Hamiltonian. Performing the quantum simulation includes determining evolution of the physical system under the Hamiltonian H by evolving the system of qubits under a unitary operator $U = e^{-iH_{qubit}t}$ generated by the qubit Hamiltonian using a variation of a split-operator algorithm.

The split-operator algorithm can be used to split evolution $e^{-iH_{qubit}t}$ under the Hamiltonian $H_{qubit}$ into separate evolutions under the kinetic and potential energy parts of the Hamiltonian. This is particularly useful because the terms in the kinetic energy part of the Hamiltonian (those with coefficients $\tilde{T}_{pg}$) can be diagonalized by an efficient circuit transformation C, leading to a sum of single-qubit terms, that is $$\sum_{pq} \tilde{T}_{pq}(X_p Z_{r_i} Z_{r_i+1} \ldots Z_{r_{i+k}} X_q + Y_p Z_{r_i} Z_{r_i+1} \ldots Z_{r_{i+k-1}} Z_{r_{i+k}} Y_q) =$$

$$C\left(\sum_p T_p Z_p\right) C^\dagger. \quad (5)$$

The diagonalizing circuits C, C\ change between the position and momentum bases using either the Fast Fermionic Fourier Transform or Givens rotations. In the split-operator algorithm, the Trotter-Suzuki approximation can be applied to divide evolution under the total Hamiltonian $H_{qubit}$ into two evolutions: a first evolution $e^{-iTt}$ under the kinetic energy term $T=C(\Sigma_p T_p Z_p)C^\setminus$ and a second evolution $e^{-i(U+V)t}$ under the potential energy terms $U+V = \Sigma_p \check{U}_p Z_p + \Sigma_{pq} \check{V}_{pq} Z_p Z_q$.

Symmetrizing these evolutions to give a second-order Trotter step approximates time evolution under the total Hamiltonian by blocks of evolutions separated by the circuit C and its inverse C\

$$e^{-iH_{qubit}t} \approx \quad (4)$$

$$C\left[\prod_p e^{-\frac{iT_p Z_p t}{2}}\right] C^\dagger \left[\prod_p e^{-i\check{U}_p Z_p t} \prod_{pq} e^{-i\check{V}_{pq} Z_p Z_q t}\right] C \left[\prod_p e^{-\frac{iT_p Z_p t}{2}}\right] C^\dagger.$$

Equation (4) describes a single second-order Trotter step. The approximation can be refined by dividing t into such steps, each of time t/r.

There are a number of choices for how to symmetrize the split-operator Trotter step. Instead of using equation (4), which approximates evolution for r Trotter steps as $e^{-iHt} \approx (e^{-iTt/2r}e^{-i(U+V)t/r}e^{-iTt/2r})^r$, an alternative choice approximates evolution for r Trotter steps as $e^{-iHt} \approx (e^{-i(U+v)t/2r} e^{-iTt/r} e^{-i(U+v)t/2r})^r$, where a single-order Trotter step of this form is given by equation (5) below.

$$e^{-iH_{qubit}t} \approx \left[\prod_p e^{-\frac{i\check{U}_p Z_p t}{2}} \prod_{pq} e^{-i\check{V}_{pq} Z_p Z_q t}\right] \quad (5)$$

$$C\left[\prod_p e^{-iT_p Z_p t}\right] C^\dagger \left[\prod_p e^{-\check{U}_p Z_p t} \prod_{pq} e^{-i\check{V}_{pq} Z_p Z_q t/2}\right]$$

When implementing the different circuits in the split-operator steps given by equation (4) or (5) each term $e^{-i\tilde{T}_p Z_p t}$, $e^{-i\check{U}_p Z_p t}$ or $e^{-i\check{V}_{pq} Z_p Z_q t}$ requires one arbitrary rotation, whether time evolution is implemented or the evolution is directionally controlled on an ancilla $|c\rangle |\psi\rangle \mapsto |c\rangle c \, e^{-iHt(-1)^c}|\psi\rangle$ that can be used for phase estimation. Therefore, with N spin-orbitals, at most N(N+3)/2 rotations are needed to determine evolution under all the terms in the Hamiltonian, and the Trotter step circuit can be completed with one application each of the basis change circuit C and its inverse C\.

At first glance, the number of gates required for the two Trotter steps given by equations (4) and (5) might appear to be different. The number of terms in T is linear in the number of spin-orbitals, whereas the number of terms in U+V is quadratic in the number of spin-orbitals. It may therefore be expected that equation (5)—which has $e^{-i(U+v)t}$ appear twice—requires many more gates than equation (4)—in which $e^{-i(U+v)t}$ only appears once. On the other hand, C or C\ appears four times in equation (4) but only twice in equation (5), which could indicate that equation (4) could use more gates.

However, this intuition is deceptive. Because the number of Trotter steps r is typically very large, e.g., r>400, and the beginning and end of both split-operator steps merge together, the difference in the costs is negligible. The result of this merging is that the cost of an r-Trotter step simulation is nearly identical for the two competing orderings of terms. It is in the final Trotter step that the two orderings differ: equation (4) applies C one more time and $e^{-i(U+v)t}$ one fewer time than equation (5). Both variants apply C, C\, $e^{-iTt}$t, and $e^{-i(U+v)t}$ once in each of the remaining r−1 Trotter steps, completely outweighing this final difference.

Rather, it is differences in the number of Trotter steps r required for accurate simulation—dictated by the Trotter error of the two steps—that dominate the difference in cost. Therefore, when performing the example process 200, the chosen Trotter step construction is dependent on which split-operator step yields the smaller Trotter error.

When implementing evolution of the system of qubits under the unitary operator $U=e^{-iH_{qubit}t}$ given by equations (4) and (5) above, the system implements the evolution of the unitary operator generated by the two-qubit interaction terms $\Pi_{pq}e^{-i\check{V}_{pq} Z_p Z_q t}$ in layers such that every value of $\check{V}_{p,q}$ determined, e.g., simulated, within a given layer is the same (step 204). That is, the system applies multiple layers of quantum logic gates to the system of qubits, wherein each application of a layer of the multiple layers evolves the system of qubits under a unitary operator generated by a respective subset of the multiple two-qubit interaction terms and the value of the two-qubit interaction term coefficients of the subset of the multiple two-qubit interaction terms that generate the unitary operator is constant. A method for choosing the interactions simulated in each of the multiple layers of quantum logic gates is described in more detail below with reference to FIGS. 3 and 4.

By ordering the simulation of the terms in $\Pi_{pq}e^{-i\check{V}_{pq} Z_p Z_q t}$ in this way, the rotation operations used in each layer all have the same rotation angle. This enables the rotation operations within each layer to be fully combined using Hamming weight phasing. Hamming weight phasing allows M parallel rotations by the same angle to be reduced to $\lfloor \log_2(M+1) \rfloor$ rotations by different angles, and 4M−4 additional T gates, using M−1 ancilla qubits. Because synthesizing arbitrary rotations is very costly on a fault-tolerant quantum computer, this can lead to large savings. An example application of Hamming weight phasing is described below.

The system measures the evolved system of qubits (step 206). In some implementations this may include measuring a phase accumulated during the determined evolution on a separate ancilla qubit. This may, for example, allow the electronic ground state energy for a single value of a set of nuclear coordinates to be determined.

Based on the measurements of the evolved system of qubits, the system determines one or more properties of the physical system (step 208).

For example, in some implementations the Hamiltonian describing the physical system may characterize a chemical. In these implementations the system may perform the steps 204 and 206 for various nuclear coordinates (depending on the particular chemical characterized by the Hamiltonian), wherein measuring the evolved system of qubits includes measuring the energy as a function of the various nuclear coordinates. Such measurement results can be used to produce a potential energy surface from which the rate of a chemical reaction can be determined.

As another example, in some implementations the Hamiltonian describing the physical system may characterize a material. In these implementations the system may measure the electronic ground state energy and use the ground state energy to determine physical properties of the material. For example, information about the material's equilibrium crystal structure may be determined by performing measurements on a plurality evolved systems of qubits, each system representing a different set of nuclear coordinates for the material. From these measurements, a ground state energy may be determined for each set of nuclear co-ordinates. The lowest ground state energy determined from these measurements may correspond to the crystal structure on the material. The other ground state energies may be used to determine other physical properties of the system, such as phase transitions between different structures. Other properties that may be determined for a material by simulating a Hamiltonian in this way include: magnetic ordering; electronic structure; electrical properties of the material, such as the conductivity; and/or mechanical properties, such as the Young's modulus and/or compressibility.

FIG. 3A is a flow diagram of an example process 300 for determining interactions in each of multiple layers of quantum logic gates that are applied to an even number of qubits. For convenience, the process 300 will be described as being performed by a system of one or more classical or quantum computing devices located in one or more locations. For example, a quantum computation system, e.g., the system 100 of FIG. 1, appropriately programmed in accordance with this specification, can perform the process 300.

Figure 4:
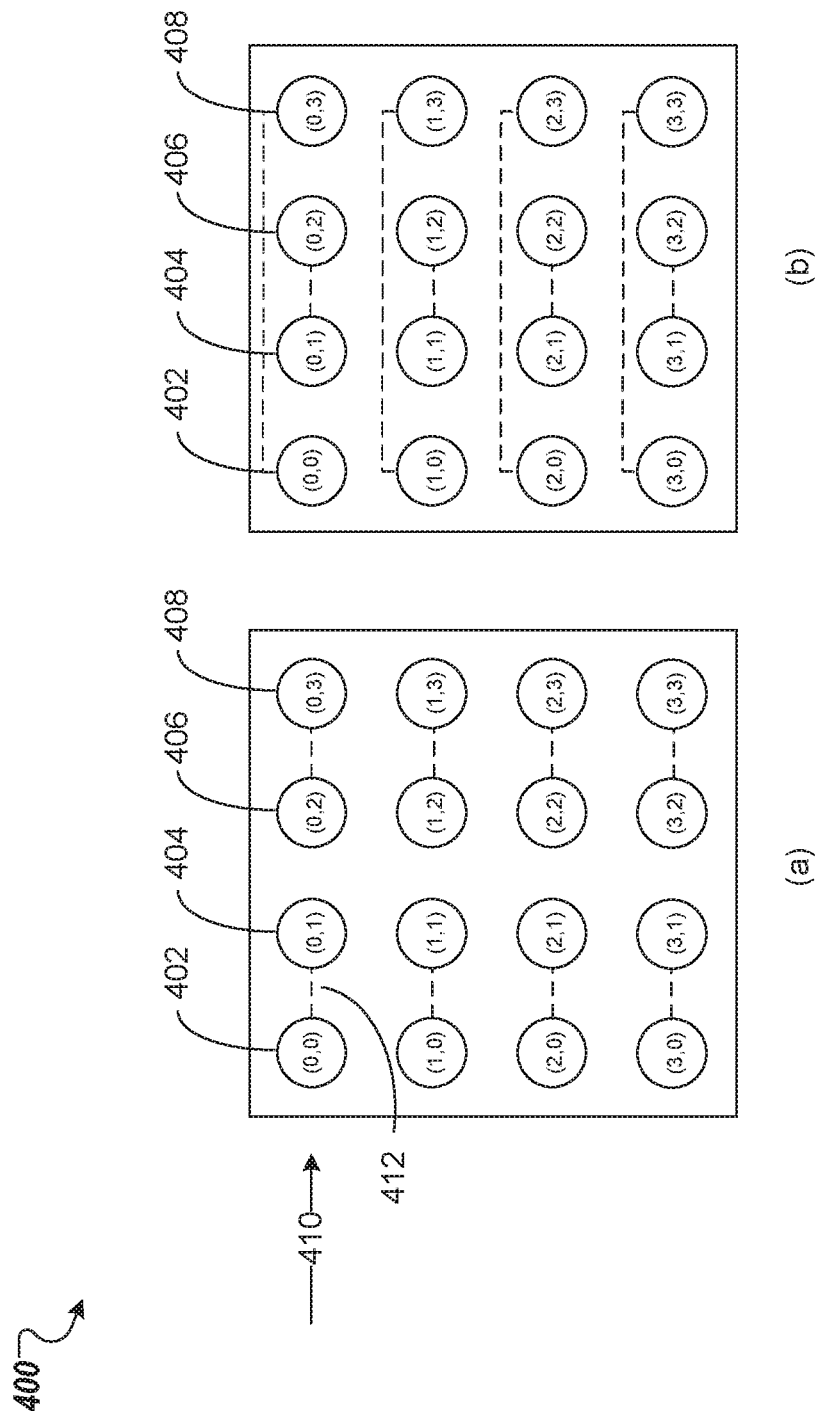
FIG. 4 is a diagram of two example layers of qubit interactions.

The system arranges the N qubits as a two-dimensional grid of qubits, wherein the position of each qubit in the grid is represented by a position vector p (step 302). An illustration of an example 4×4 grid of 16 qubits is shown in FIG. 4. The position vector is given by a two-dimensional vector. The components of the vector are, in some implementations, integers which label a position in the two-dimensional grid of qubits.

For each index vector s, the system defines a set of pairs of qubits {(p, p+s)} for each position vector p running over all qubits (step 304). The translation-invariance of the coefficient $\tilde{V}_{p,q}$ guarantees, for all qubit position vectors p, that $$\tilde{V}_{0,s} = \tilde{V}_{p,p+s} \qquad (6)$$

When the number of qubits N is even there are N such pairs of qubits (p, p+s), given by the N−1 different index vectors s on the grid. However, because each of these interactions is between two qubits, at most N/2 of them can be performed simultaneously in a layer. Therefore, for each index vector s, the system generates two layers of qubit interactions based on the defined set of pairs of qubits, wherein each qubit in each layer interacts with one other qubit (step 306). In each layer, N/2 interactions of equal strength can be simulated, yielding N/2 equiangular rotations combinable using Hamming weight phasing. Two example layers of interacting qubits for an index vector s=(0, 1) are illustrated in FIG. 4. The index vector is given by a two-dimensional vector. The components of the vector are, in some implementations, integers which label a difference in position between two qubits in the two-dimensional grid of qubits, e.g. s=(m,n), where m and n integers labelling the difference in position of two qubits along two perpendicular axes.

In general, there are N−1 different index vectors s that must be iterated over, since the final vector, s=0, does not appear because it corresponds to a qubit interacting with itself. Each index vector s is applied in two layers, leading to 2N−2 layers each determining N/2 interactions. In each of the 2N−2 layers, Hamming weight phasing can be applied over every term $e^{-i\tilde{V}_{p,p+s}Z_p Z_{p+s}t}$, because each coefficient $\tilde{V}_{p,p+s}$ is the same, and hence each of the N/2 rotation angles is the same. This allows Hamming weight phasing to be applied over every rotation in each layer, reducing the number of rotations required per layer from N/2 to $\lfloor \log_2(N/2)+1 \rfloor$, at a cost of an additional 2N−4 T gates. Over all the 2N−2 layers, the T-cost to determine all the two-qubit terms in a step of Trotter evolution is $4(N-1)(N-2)+T_{synth}(2N-2)\lfloor \log_2 N \rfloor$, where $T_{synth}=O(\log(1/\epsilon))$ represents the number of T gates required to synthesize each rotation, with $\epsilon$ representing required synthesis precision.

FIG. 3B is a flow diagram of an example process 350 for determining interactions in each of multiple layers of quantum logic gates that are applied to an odd number of qubits. For convenience, the process 350 will be described as being performed by a system of one or more classical or quantum computing devices located in one or more locations. For example, a quantum computation system, e.g., the system 100 of FIG. 1, appropriately programmed in accordance with this specification, can perform the process 350.

The system arranges the N qubits as a two-dimensional grid of qubits, wherein the position of each qubit in the grid is represented by a position vector p (step 352).

For each index vector s, the system defines a set of pairs of qubits {(p, p+s)} for each position vector p running over all qubits (step 354). Because the number of qubits is odd, one qubit will not be included in the defined set of pairs of qubits. Again, the translation-invariance of the coefficient $\tilde{V}_{p,q}$ guarantees, for all qubit position vectors p, that $\tilde{V}_{0,s} = \tilde{V}_{p,p+s}$.

When the number of qubits N is odd, each of the N−1 index vectors s is simulated using three rather than two layers. This is because when the number of qubits is odd, one qubit is left out in each layer when the pairs of qubits are defined. As a result there are 2N−2 layers of (N−1)/2 equiangular rotations and N−1 layers with a lone rotation. Hamming weight phasing can then be applied to reduce the (N−1)/2 equiangular rotations per layer to $$\left\lfloor \log_2\left(\frac{N-1}{2}\right) + 1 \right\rfloor$$

at cost of an additional 2N−2 T gates. Over all the layers, the T-cost to determine all the two-qubit terms in a step of Trotter evolution is $4(N-1)2+T_{synth}(N-1)(2\lfloor \log_2 N-1 \rfloor+1)$.

For both even and odd N, the cost of the rotations is reduced to $O(N \log N \log(1/\epsilon))$ using at most $4(N-1)^2$ additional T gates. This is to be compared with the $O(N^2 \log(1/\epsilon))$ cost when Hamming weight phasing not applied, or when the interaction terms are not translation-invariant. This improvement applies to any quantum simulation of electronic structure using the plane wave dual basis, or more generally to any simulation of a two-qubit interaction with the translation-invariance property given by equation (3).

FIG. 4 is a diagram 400 of two example layers (a) and (b) of qubit interactions. The two example layers are generated for index vector s=(0, 1) for the case of 16 qubits on a 4×4 grid. In both layers, qubit p interacts with qubit p+s, where the elements of the index vectors p and p+s are evaluated modulo the grid length. For example, considering the first row 410 of the 4×4 grid in layer (a), qubit 402 at position p=(0, 0) interacts with qubit 404 at position p+s=(0, 0)+(0, 1)=(0, 1), and qubit 406 at position p=(0, 2) interacts with qubit 408 at position p+s=(0, 2)+(0, 1)=(0, 3). In layer (b), qubit 404 at position p=(0, 1) interacts with qubit 406 at position p+s=(0, 1)+(0,1)=(0, 2), and qubit 408 at position p=(0, 3) interacts with qubit 402 at position p+s=(0, 3)+(0, 1)=(0, 4)=(0, 0)mod(4).

Since each of the interactions (indicated by the dotted lines, e.g., line 412) is between two qubits, at most [N=16]/2=8 interactions can be performed simultaneously in a layer. Therefore, for the index vector s=(0, 1), two layers (a) and (b) of 8 qubit interactions are generated, wherein each qubit in each layer interacts with one other qubit.

Example Application of Hamming Weight Phasing

Consider a circuit where the same single-qubit rotation $R_z(\theta)=\exp(-i\theta Z/2)$ is simultaneously applied to three different qubits. The action on the logical states is a different phase, depending only on the Hamming weight of that logical state. To be explicit, 1. the all-zero state |000⟩ picks up the phase $-3\theta/2$,
2. the three states of Hamming weight one |000⟩, |010⟩, |100⟩ each pick up a phase $-\theta/2$,
3. the three states of Hamming weight two |011⟩, |101⟩, |110⟩ are all phased by $\theta/2$, and
4. the all-one state |111⟩ picks up a phase $3\theta/2$.

Rather than applying three rotations by the same angle $R_z(\theta)$, the Hamming weight of the input states can be computed, and 2 distinct rotations can be applied to the Hamming weight: $R_z(\theta)$ to the is bit, and $R_z(2\theta)$ to the 2s bit. In this case, 1. the phase $-3\theta/2$ is applied to the all-zero state |000⟩ (Hamming weight 0),
2. $-\theta/2=-\theta+\theta/2$ is applied to |000⟩, |010⟩, |100⟩ (Hamming weight $1=01_b$ in binary),
3. $\theta/2=+\theta-\theta/2$ is applied to |011⟩, |101⟩, |110⟩ (Hamming weight $2=10_b$), and
4.

$$\frac{3\theta}{2} = +\theta + \frac{\theta}{2}$$

is applied to the all-one state |111⟩ (Hamming weight $3=11_b$).

The phases on each logical state are identical for the two procedures. However, because rotations must be synthesized using costly T gates, reducing the number of rotation gates in the circuit reduces its fault-tolerant cost.

This idea readily generalizes to the case of n repeated equiangular rotations $R_z(\theta)$ appearing in parallel in a circuit: rather than applying the n original rotations, the Hamming weight of the relevant qubits can be computed, and instead $\lfloor \log_2(n+1) \rfloor$ rotations $R_z(\theta)$, $R_z(2\theta)$, $R_z(4\theta)$, . . . can be applied to the Hamming weight. This technique is referred to as Hamming weight phasing.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for determining properties of a physical system, the method comprising:
transforming a Hamiltonian describing the physical system into a qubit Hamiltonian describing a corresponding system of qubits, wherein the qubit Hamiltonian comprises multiple two-qubit interaction terms, each two-qubit interaction term comprising a respective translation invariant two-qubit interaction term coefficient;
evolving the system of qubits under a unitary operator generated by the multiple two-qubit interaction terms, comprising:
applying multiple layers of quantum logic gates to the system of qubits, wherein each application of a layer of the multiple layers evolves the system of qubits under a unitary operator generated by a respective subset of the multiple two-qubit interaction terms;
wherein the value of the two-qubit interaction term coefficients of the subset of the multiple two-qubit interaction terms that generate the unitary operator is constant;
measuring the evolved system of qubits; and
determining, based on the measurements of the evolved system of qubits, one or more properties of the physical system.

2. The method of claim 1, wherein each of the multiple layers of quantum logic gates comprises rotations operations with a same rotation angle.

3. The method of claim 1, further comprising generating the multiple layers of quantum logic gates, comprising, for a system of N qubits wherein N is even:
arranging the N qubits as a two-dimensional grid of qubits, wherein a position of each qubit in the grid is represented by a respective position vector p;
for each index vector s:
defining a set of pairs of qubits (p, p+s) for each position vector p running over all the N qubits;
generating two layers of qubit interactions based on the defined set of pairs of qubits, wherein each qubit in each layer interacts with one other qubit.

4. The method of claim 3, wherein each of the multiple layers of quantum logic gates comprises N/2 equiangular rotation operations.

5. The method of claim 3, wherein evolving the system of qubits under a unitary operator generated by the multiple two-qubit interaction terms further comprises, in each layer of the multiple layers, applying Hamming weight phasing to rotations in the layer.

6. The method of claim 1, further comprising generating the multiple layers of quantum logic gates, comprising, for a system of N qubits, wherein N is odd:
arranging the N qubits as a two-dimensional grid of qubits, wherein a position of each qubit in the grid is represented by a respective position vector p;
for each index vector s:
defining a set of pairs of qubits (p, p+s) for each position vector p running over all the N qubits, wherein one qubit is not included in the defined set of pairs;
generating three layers of qubit interactions based on the defined set of pairs of qubits, comprising:
a first layer wherein each qubit interacts with one other qubit,
a second layer wherein each qubit interacts with one other qubit, and
a third layer comprising a single rotation operation.

7. The method of claim 6, wherein the first layer and second layer of quantum logic gates each comprises N/2 equiangular rotation operations.

8. The method of claim 3, wherein defining a set of pairs of qubits (p, p+s) for each qubit p comprises evaluating p+s modulo the grid length.

9. The method of claim 1, wherein the qubit Hamiltonian further comprises a kinetic energy term and a single-qubit potential energy term, and wherein the method further comprises evolving the system of qubits under a unitary operator generated by the kinetic energy term and a unitary operator generated by the single-qubit potential energy term.

10. The method of claim 1, wherein evolving the system of qubits under a unitary operator generated by the multiple two-qubit interaction terms, kinetic energy term or single-qubit potential energy term comprises implementing time evolution or implementing evolution directionally controlled on an ancilla.

11. The method of claim 1, wherein evolving the system of qubits under a unitary operator generated by the multiple two-qubit interaction terms, kinetic energy term or single-qubit potential energy term comprises evolving the system of qubits in a split operator Trotter step.

12. The method of claim 11, wherein the split operator Trotter step is one of multiple split operator Trotter steps that yields a smallest Trotter error.

13. The method of claim 1, wherein the Hamiltonian describing the physical system comprises an electronic structure Hamiltonian.

14. The method of claim 1, wherein the physical system comprises a chemical or material and evolving the system of qubits under the unitary operator generated by the multiple two-qubit interaction terms simulates evolution of the system of qubits under the qubit Hamiltonian, and wherein determining properties of the physical system based on the measurements of the evolved system of qubits comprises determining properties of the chemical or material using the simulated evolution of the system of qubits under the qubit Hamiltonian.

15. An apparatus for determining properties of a physical system, the apparatus comprising:
one or more classical processors;
quantum hardware comprising:
a system of interacting qubits, wherein interactions between qubits are controllable; and
a plurality of control devices configured to apply quantum logic gates to the system of interacting qubits and measure the system of interacting qubits;
wherein the apparatus is configured to:
transform, by the one or more classical processors, a Hamiltonian describing the physical system into a qubit Hamiltonian describing a corresponding system of qubits, wherein the qubit Hamiltonian comprises multiple two-qubit interaction terms, each two-qubit interaction term comprising a respective translation invariant two-qubit interaction term coefficient;
evolve the system of qubits under a unitary operator generated by the multiple two-qubit interaction terms, comprising:
applying, by the quantum hardware, multiple layers of quantum logic gates to the system of qubits, wherein each application of a layer of the multiple layers evolves the system of qubits under a unitary operator generated by a respective subset of the multiple two-qubit interaction terms, wherein the value of the two-qubit interaction term coefficients of the subset of the multiple two-qubit interaction terms that generate the unitary operator is constant;

measure, by the quantum hardware, the evolved system of qubits; and determine, based on the measurements of the evolved system of qubits and by the one or more classical processors, one or more properties of the physical system.

* * * * *